US007920610B2

(12) United States Patent
Loeber et al.

(10) Patent No.: US 7,920,610 B2
(45) Date of Patent: Apr. 5, 2011

(54) PULSE MODE MODULATION IN FREQUENCY CONVERTED LASER SOURCES

(75) Inventors: David August Sniezek Loeber, Horseheads, NY (US); Nobutoshi Sekiguchi, Kanagawa (JP); Daniel Ohen Ricketts, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/548,958

(22) Filed: Aug. 27, 2009

(65) Prior Publication Data

US 2011/0051762 A1 Mar. 3, 2011

(51) Int. Cl.
*H01S 3/13* (2006.01)
(52) U.S. Cl. .............. 372/29.014; 372/29.015; 372/21; 372/30; 372/38.02; 372/38.07; 353/30; 353/34; 353/35; 353/85; 353/121
(58) Field of Classification Search .............. 372/21, 372/29.014, 29.015, 30, 38.02, 38.07; 353/31–37, 353/85, 121; 359/196, 237
See application file for complete search history.

(56) References Cited

U.S. PATENT DOCUMENTS

| | | | |
|---|---|---|---|
| 5,325,383 A | | 6/1994 | Davis et al. |
| 5,874,981 A | | 2/1999 | Haas et al. |
| 5,946,334 A | * | 8/1999 | Ema et al. .............. 372/38.01 |
| 6,118,798 A | * | 9/2000 | Ema et al. .............. 372/29.011 |
| 7,269,193 B2 | | 9/2007 | Morimoto et al. |
| 7,330,490 B2 | * | 2/2008 | Furukawa et al. .............. 372/21 |
| 7,483,458 B2 | * | 1/2009 | Bhatia et al. .............. 372/38.02 |
| 2007/0086495 A1 | * | 4/2007 | Sprague et al. .............. 372/38.02 |
| 2010/0322272 A1 | * | 12/2010 | Hu et al. .............. 372/29.021 |

* cited by examiner

*Primary Examiner* — Minsun Harvey
*Assistant Examiner* — Delma R Forde
(74) *Attorney, Agent, or Firm* — Kwadjo Adusei-Poku

(57) ABSTRACT

Methods of operating a frequency-converted laser source are disclosed. According to particular disclosed embodiments, a laser diode is driven in a pulsed mode to define pixel intensity values corresponding to desired gray scale values of image pixels in an image plane of the laser source. The pixel intensity values are a function of a laser control signal comprising a discontinuous pulse component, a relatively constant intensity component I, and a continuously variable intensity component I*. The pulse width w of the discontinuous pulse component is selected from a set of discrete available pulse widths according to a desired pixel gray scale value. A low-end pulse width w of the set of available pulse widths is established for a range of low-end pixel gray scale values and progressively larger pulse widths w are established for ranges of progressively higher pixel gray scale values. The relatively constant intensity component I makes a relatively insignificant contribution to pixel intensity at the low-end pulse width w for the range of low-end pixel gray scale values and assumes a non-zero value for enhanced conversion efficiency at the progressively larger pulse widths w established for the higher pixel gray scale values. The continuously variable intensity component I* varies according to the desired gray scale value of the selected pixel and the contributions of the relatively constant intensity component I and the pulse width w to pixel intensity.

16 Claims, 4 Drawing Sheets

PULSE MODE MODULATION IN FREQUENCY CONVERTED LASER SOURCES

BACKGROUND

1. Field of the Disclosure

The present disclosure relates to frequency-converted laser sources and, more particularly, to frequency-converted laser sources.

2. Technical Background

The present invention relates generally to semiconductor lasers, which may be configured in a variety of ways. For example and by way of illustration, not limitation, short wavelength sources can be configured for high-speed modulation by optically coupling the output of a semiconductor laser with the waveguide of a light wavelength conversion device, such as a second harmonic generation (SHG) crystal. The SHG crystal can be configured to generate higher harmonic waves of the fundamental laser signal by tuning, for example, a 1060 nm DBR or DFB laser to the spectral center of a SHG crystal, which converts the wavelength to 530 nm. However, the wavelength conversion efficiency of an SHG crystal, such as MgO-doped periodically poled lithium niobate (PPLN), is strongly dependent on the intensity of the fundamental laser signal, which may, for example arise from a distributed feedback (DFB) laser, a distributed Bragg reflector (DBR) laser, a vertical cavity surface-emitting laser (VCSEL), a vertical external cavity surface-emitting laser (VECSEL) or a Fabry-Perot laser.

BRIEF SUMMARY

By way of example, and not limitation, in scanning-type laser projection systems, the aforementioned frequency converted laser sources can be configured as low-cost, compact, and efficient sources of green light. Embodiments of the present disclosure relate to specific methods for optimizing electrical power efficiency in frequency converted green lasers and are particularly useful where system requirements dictate relatively high modulation frequencies. For example, when such lasers are used in a scanning projection source module, for video applications using scanning laser beams, the optical power typically needs to be modulated at frequencies approaching or exceeding 40 MHz and at extinction ratio of at least 30 dB. The present inventors have recognized that, in these types of systems, conversion efficiency increases with the power of the fundamental laser signal, i.e., the power of the IR laser in the case of a frequency-doubled optical package employing an SHG crystal for wavelength conversion.

For display applications, the desired (green) output intensity varies based on image content and the conversion efficiency is only maximized at high green output levels. For portable image projection applications, one of the key parameters is battery life and the most descriptive way of defining the impact of the green laser source on battery life, is to consider the wall plug efficiency of the projector under image modulation conditions. Because simple linear modulation schemes result in less than optimum conversion efficiencies, pulse width modulation has been proposed as a mechanism for maximizing IR-to-green conversion efficiency. However, many applications require modulation rates greater than 2 Ghz, which requires very narrow pulses in the laser signal. For some projection applications, projection pixels can be as short as 10 to 30 ns and, for common applications, at least 20 db of dynamic range is required. As such, minimum pulse durations of 0.1 to 0.3 ns would be required for pulse width modulation (PWM) schemes in these applications. In some applications, up to 30 db of dynamic range may also be required which extends this even further requiring 10 Ghz modulation capability.

Even though class-leading IR lasers have impressive modulation capabilities, there would be significant electronic limitations for generating such high speed modulation signals. Specifically, high intensity seed lasers require high currents to generate desired output levels and state of the art on-off current drivers that meet the current requirement of such high intensity lasers typically have rise and fall times of 1 to 2 ns—a factor that can significantly limit the modulation speed of a compact laser. Alternatively to achieve the combination of high modulation speed and extinction ratio, high speed analog circuits often require costly components and design and manufacturing techniques. Considering these practical limitations, a traditional PWM scheme would suffer from reduced image resolution or limited dynamic range. As an example within the constraints of available driver technology and resolutions discussed above, a projection system could be limited to pixels of 100 ns (20 dB dynamic range) or 40 ns (if 16 dB is an acceptable dynamic range). However, to achieve VGA quality resolution in a scanning application, it is often necessary to generate pixels within the range 25 to 35 ns or shorter.

According to aspects of the present disclosure, a novel high speed modulation scheme is proposed that addresses some or all of the aforementioned design issues and is specifically optimized for synthetic green lasers based on a non-linear wavelength conversion. Specifically, a continuous modulation scheme is described, which retains much of the conversion efficiency of the basic PWM scheme, while meeting the full dynamic range requirement achievable with the less power efficient linear modulation. An additional benefit of the modulation schemes developed is the inclusion of a discontinuity free and definable intensity versus grey level relationship function. This feature is particularly useful for the precise color balancing required of many high quality projection displays.

In accordance with various embodiments of the present disclosure, methods of operating a frequency-converted laser source are disclosed. According to particular disclosed embodiments, a laser diode is driven in a pulsed mode to define pixel intensity values corresponding to desired gray scale values of image pixels in an image plane of the laser source. The pixel intensity values are a function of a laser control signal comprising a discontinuous pulse component, a relatively constant intensity component I, and a continuously variable intensity component I*. The pulse width w of the discontinuous pulse component is selected from a set of discrete available pulse widths according to a desired pixel gray scale value. A low-end pulse width w of the set of available pulse widths is established for a range of low-end pixel gray scale values and progressively larger pulse widths w are established for ranges of progressively higher pixel gray scale values. The relatively constant intensity component I makes a relatively insignificant contribution to pixel intensity at the low-end pulse width w for the range of low-end pixel gray scale values and assumes a non-zero value for enhanced conversion efficiency at the progressively larger pulse widths w established for the higher pixel gray scale values. The continuously variable intensity component I* varies according to the desired gray scale value of the selected pixel and the contributions of the relatively constant intensity component I and the pulse width w to pixel intensity.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 6:
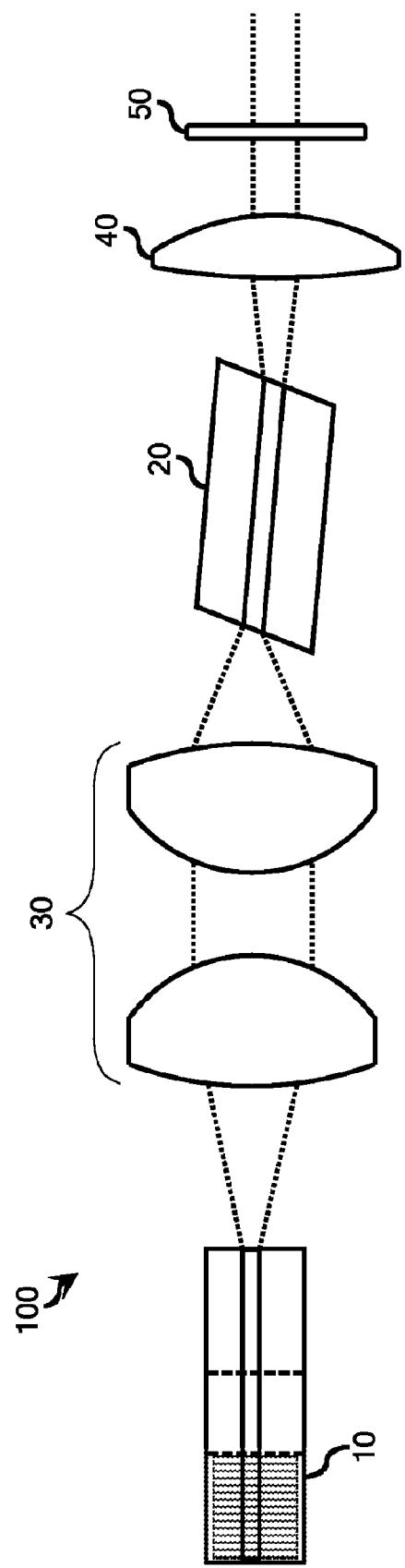
FIG. 6 is a schematic illustration of some typical components of a frequency-converted laser source.

One of the contemplated operational methods of the present disclosure can be illustrated with reference to the diagram of FIG. 1 and the frequency converted laser source 100 of FIG. 6, which typically comprises a laser diode 10 that is optically coupled to a wavelength conversion device 20 for conversion of a pulsed optical signal generated by the laser diode 10. They laser source may also comprise a variety of additional components including, for example, coupling optics 30, collimating optics 40, and an optical filter 50.

According to the illustrated method, the laser diode 10 is driven in a pulsed mode to define pixel intensity values that correspond to desired gray scale values of image pixels in the image plane of the laser source 100. The pixel intensity values are a function of a laser control signal that comprises a discontinuous pulse component of pulse width w, a relatively constant intensity component I, and a continuously variable intensity component I*; each of which are illustrated in FIG. 1 for a variety of different pixel gray scale value ranges. More specifically, in FIG. 1, the pulse width w of the discontinuous pulse component is selected from a set of discrete available pulse widths such that the particular value of the pulse width w, varies according to the desired pixel gray scale value:

TABLE 1

| Desired Pixel Gray Scale Value | Pulse Width w |
|---|---|
| 0%-18% | $0.75^6$ P |
| 18%-24% | $0.75^5$ P |
| 24%-32% | $0.75^4$ P |
| 32%-42% | $0.75^3$ P |
| 42%-56% | $0.75^2$ P |
| 56%-75% | 0.75 P |
| 75%-Full | P |

Figure 1:
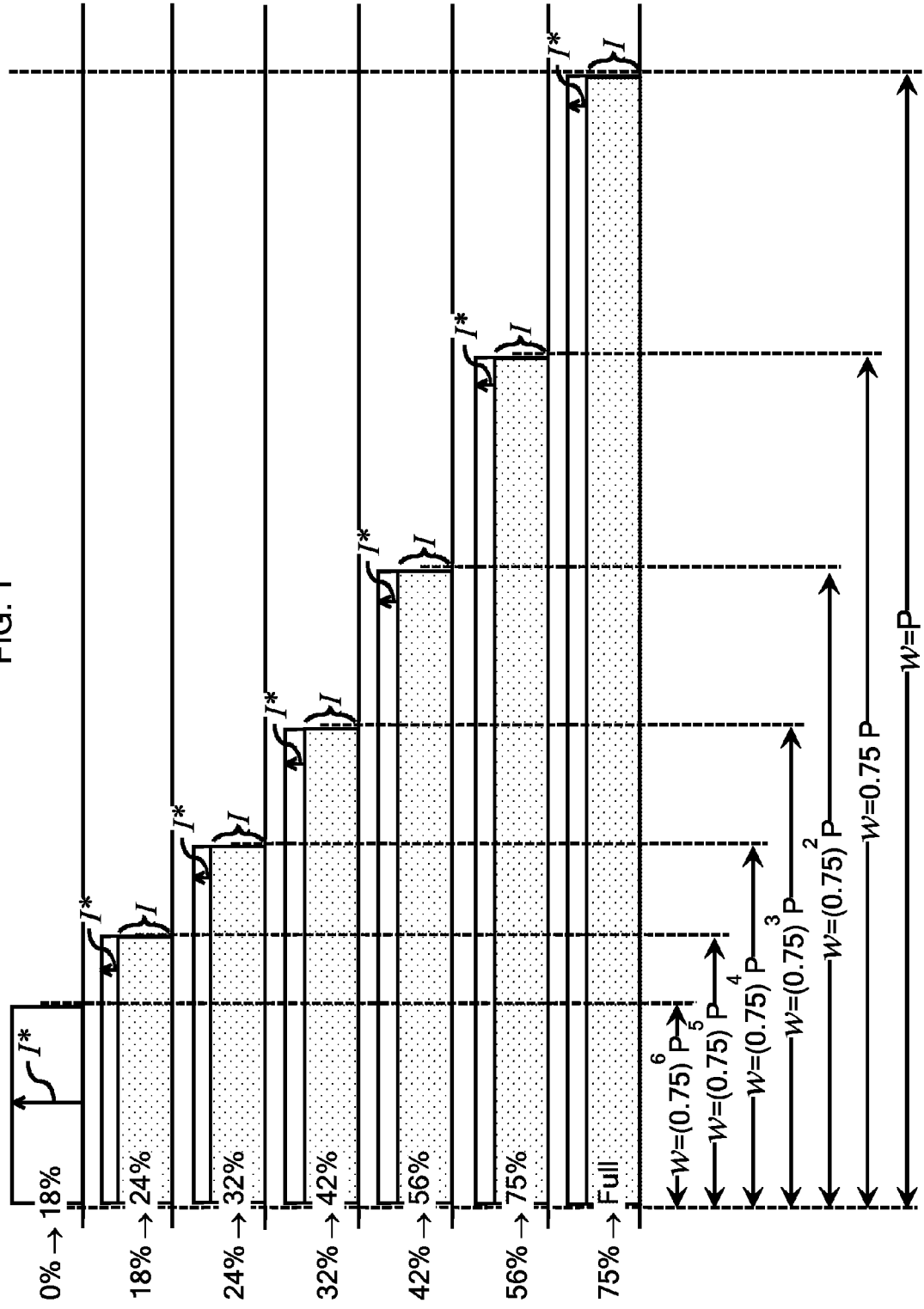
FIG. 1 is a diagram illustrating a method of operating a frequency-converted laser source according to one embodiment of the present disclosure, which methodology can be referred to as geometric pulse modulation.
Figure 3:
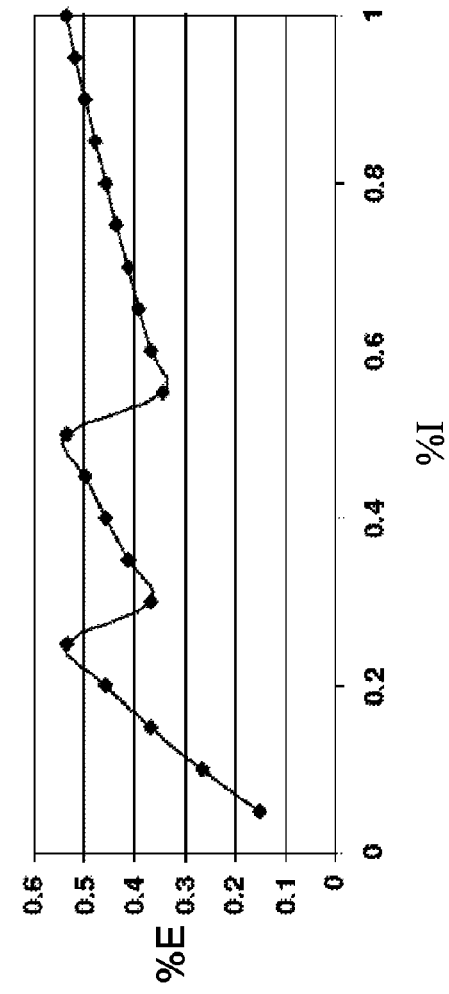
FIGS. 3 is a plot of conversion efficiency versus desired gray scale value for the operational methodology illustrated in FIGS. 1 and 2.

As is illustrated in FIG. 1 and Table 1, the low-end pulse width w of the set of available pulse widths is established for a range of low-end pixel gray scale values, i.e., 0%-18%, and progressively larger pulse widths w are established for ranges of progressively higher pixel gray scale values, i.e., 18%-24%, 32%-42%, etc. Further, the relatively constant intensity component I makes a relatively insignificant contribution to pixel intensity at the low-end pulse width w and assumes non-zero values at the progressively larger pulse widths w, which are established for the higher pixel gray scale values. In this manner, conversion efficiency in the laser source 100 is enhanced because the relatively constant intensity component I stays above zero for a major portion of the gray scale spectrum. In fact, as is illustrated in FIG. 1, for all but the low-end pixel gray scale values, i.e., 0%-18%, the relatively constant intensity component I dominates the variable intensity component I*, in terms of their respective contributions to pixel intensity. As a result, the laser source 100, which is susceptible to low conversion efficiency at low input intensities, can be operated at elevated conversion efficiencies because the source ramps-up more quickly to elevated input intensities and subsequently avoids a return to low input intensities as the desired pixel gray scale value increases. This behavior is illustrated in the graph of FIG. 3, which plots conversion efficiency E (vertical axis) versus desired gray scale value % I (horizontal axis) of the selected pixel, and is directly attributable to the presence of the discontinuous pulse component (pulse width w), the relatively constant intensity component I, and the continuously variable intensity component I* in the laser control signal.

For its part, the continuously variable intensity component I* provides an additional intensity control function because it varies within each band of gray scale values, according to the desired gray scale value of the selected pixel. The particular value of the continuously variable intensity component I* will also be a function of the contributions of the relatively constant intensity component I and the pulse width w to pixel intensity.

As is illustrated in FIG. 1, the continuously variable intensity component I* and the relatively constant intensity component I occupy a common portion of the effective pixel width at the pulse widths w that are larger than the low-end pulse width w. Further, as is also evident from the diagram of FIG. 1 and the data of Table 1, the continuously variable intensity component I*, the relatively constant intensity component I, and the set of discrete available pulse widths are selected to ensure geometric intensity equivalence as the control signal transitions between adjacent pulse widths w of the set of discrete available pulse widths. More specifically, referring to the transition from the low-end pixel gray scale values, i.e., 0%-18%, to the next higher band of gray scale values, i.e., 18%-24%, it is noted that the pixel intensity in the 0%-18% band, with the continuously variable intensity component I* at its maximum, is geometrically equivalent to the pixel intensity in the 18%-24% band, with the continuously variable intensity component I* at its minimum. As a further example, referring to the transition from the 18%-24% band, to the next higher band of gray scale values, i.e., 24%-32%, it is noted that the pixel intensity in the 18%-24% band, with the continuously variable intensity component I* at its maximum, is geometrically equivalent to the pixel intensity in the 24%-32% band, with the continuously variable intensity component I* at its minimum.

According to one aspect of the present disclosure, it is contemplated that the set of discrete available pulse widths and the relatively constant intensity component I can be derived to preserve the aforementioned geometrically equivalent, smooth transitions by referring to a geometric fraction b of the effective pixel width P*. More specifically, the discrete pulse widths of the set of discrete available pulse widths can be established by referring to the following geometric function:

$$w = (b)^n P^*$$

where $$b \leq (1 - w_{min}/P^*)$$

and $w_{min}$ represents a practical minimum pulse width of the laser source, P* is the effective pixel width, b is the geometric fraction of the effective pixel width, and n is a positive integer representing the available pulse widths within the set of discrete available pulse widths. Preferably, although not required, the maximum values for n and the geometric fraction b are selected such that the low-end pulse width w of the set of available pulse widths is greater than the practical minimum pulse width $w_{min}$ of the laser source.

Figure 2:
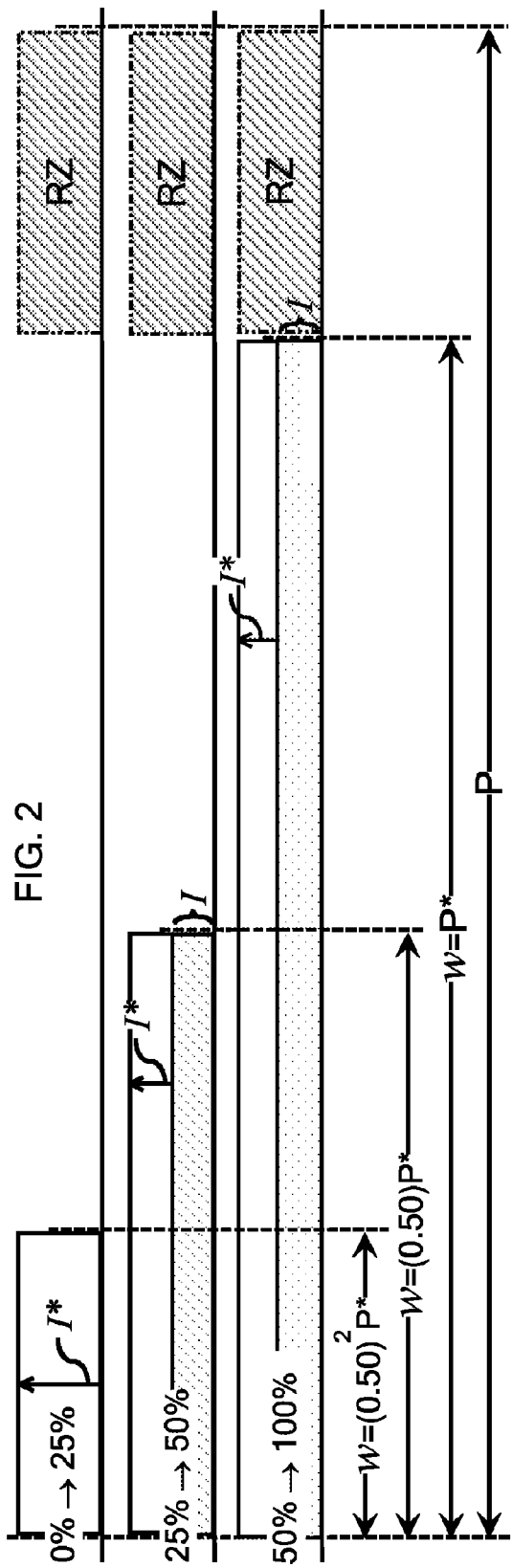
FIG. 2 is a diagram illustrating a variation of the methodology illustrated in FIG. 1.

The geometric fraction b is selected to optimize conversion efficiency, taking into account the particular circumstances in which the laser source is employed. For example, in FIG. 1, the geometric fraction b is ¾, i.e., 0.75, but it is contemplated that it may be sufficient to select ½, i.e., 0.5, as the geometric fraction b, in which case the values for pulse width w, the relatively constant intensity component I, and the continuously variable intensity component I* would be as illustrated in FIG. 2. In practicing modulation schemes similar to that illustrated with reference to FIGS. 1 and 2, it is noted that it will often be preferable to ensure that the low-end pulse width w does not exceed approximately 25% of the effective pixel width P*. More specifically, it may often be preferable to ensure that the low-end pulse width w is between approximately 2 ns and approximately 10 ns and the effective pixel width P* is between approximately 20 ns and approximately 50 ns.

Figure 4:
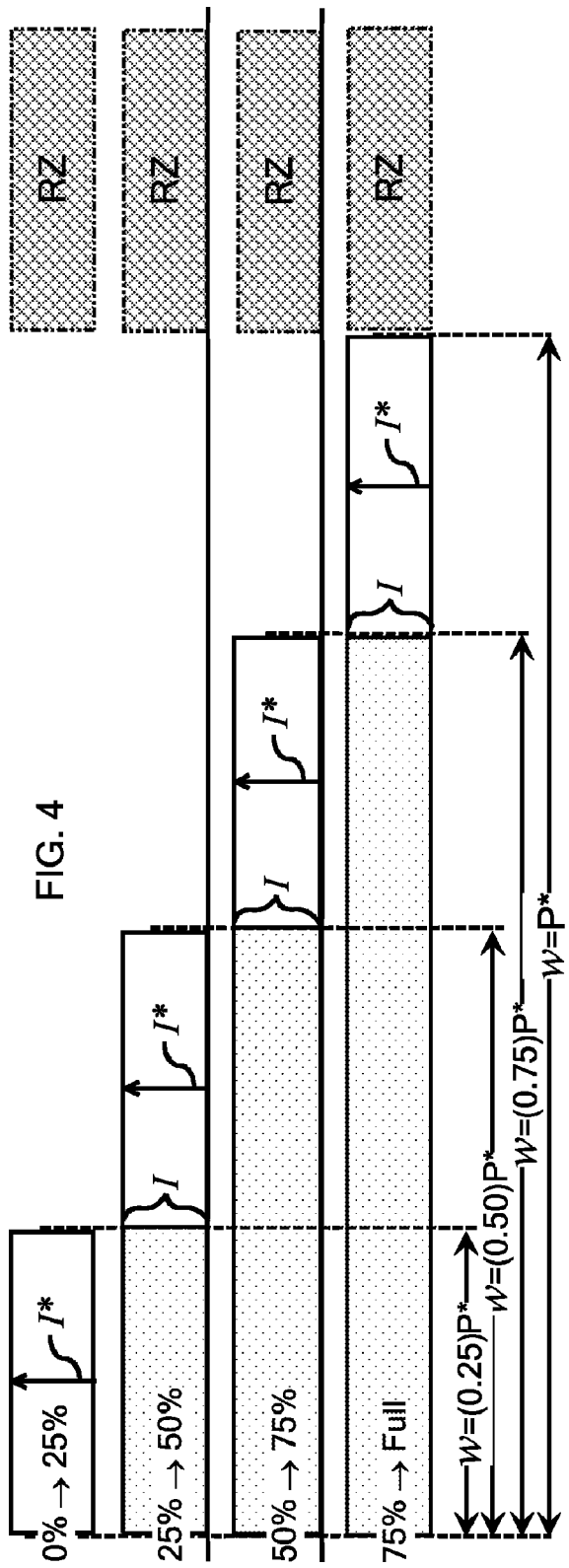
FIG. 4 is a diagram illustrating a method of operating a frequency-converted laser source according to another embodiment of the present disclosure, which methodology can be referred to as continuous pulse modulation.

The embodiments of the present disclosure illustrated with reference to FIGS. 1-3 can be referred to as geometric pulse modulation schemes. As an alternative, FIG. 4 represents a modulation scheme where the continuously variable intensity component I* and the relatively constant intensity component I occupy different portions of the effective pixel width. As is illustrated in FIG. 4, once the control signal advances beyond the low-end pulse width, i.e., beyond w=0.25P*, the relatively constant intensity component I occupies at least as much of the effective pixel width w as is occupied by the continuously variable intensity component I*. As the effective pixel width w increases, the relatively constant intensity component I occupies at a progressively larger portion of the effective pixel width w, a control signal characteristic that enhances conversion efficiency by ensuring that a significant portion of the control signal is at a relatively high intensity.

Figure 5:
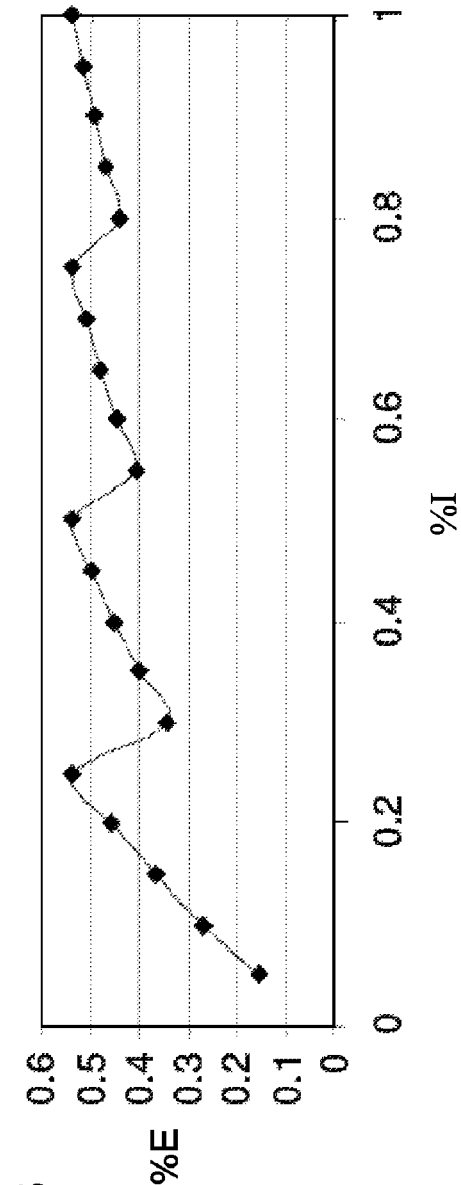
FIG. 5 is a plot of conversion efficiency versus desired gray scale value for the operational methodology illustrated in FIG. 4.

As is the case with the geometric pulse width modulation schemes described herein, for the modulation scheme of FIG. 4, the continuously variable intensity component I*, the relatively constant intensity component I, and the set of discrete available pulse widths are selected to ensure geometric intensity equivalence as the control signal transitions between adjacent pulse widths w of the set of discrete available pulse widths. Further, it will typically be preferable to maximize the relatively constant intensity component I at the progressively larger pulse widths w. Finally, it is contemplated that the set of discrete available pulse widths can be partitioned uniformly, as is illustrated in FIG. 4, or non-uniformly, and that the low-end pulse width w will not usually exceed approximately 25% of the effective pixel width P*. FIG. 5 is similar to FIG. 3, with the exception that it represents a plot of conversion efficiency E (vertical axis) versus desired gray scale value %l (horizontal axis) for the modulation scheme of FIG. 4.

It is noted that control signals disclosed herein may include return-to-zero (RZ) or wavelength recovery components (See FIGS. 2 and 4) similar to those disclosed in published US Patent Application 2008/0089373 A1, in which case the effective pixel width P* would actually be less than the actual pixel width P. In addition, it is noted that the concepts of the present disclosure are applicable to a variety of frequency-converted laser configurations including, but not limited to, configurations that utilize frequency conversion including and beyond second harmonic generation (SHG). The concepts of the present disclosure are also applicable to a variety of applications, including multi-color laser scanning projectors.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term "approximately" is also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. A method of operating a frequency-converted laser source comprising a laser diode optically coupled to a wavelength conversion device for conversion of a pulsed optical signal generated by the laser diode, wherein:

the laser diode is driven in a pulsed mode to define pixel intensity values corresponding to desired gray scale values of image pixels in an image plane of the laser source;

the pixel intensity values are a function of a laser control signal comprising a discontinuous pulse component, a relatively constant intensity component I, and a continuously variable intensity component I*;

the pulse width w of the discontinuous pulse component is selected from a set of discrete available pulse widths according to a desired pixel gray scale value;

a low-end pulse width w of the set of available pulse widths is established for a range of low-end pixel gray scale values;

progressively larger pulse widths w are established for ranges of progressively higher pixel gray scale values;

the relatively constant intensity component I makes a relatively insignificant contribution to pixel intensity at the low-end pulse width w for the range of low-end pixel gray scale values and assumes a non-zero value for enhanced conversion efficiency at the progressively larger pulse widths w established for the higher pixel gray scale values; and the continuously variable intensity component I* varies according to the desired gray scale value of the selected pixel and the contributions of the relatively constant intensity component I and the pulse width w to pixel intensity.

2. A method as claimed in claim 1 wherein:

the relatively constant intensity component I makes a relatively insignificant contribution to pixel intensity at the low-end pulse width w; and the continuously variable intensity component I* and the relatively constant intensity component I occupy a common portion of the effective pixel width at the progressively larger pulse widths w.

3. A method as claimed in claim 2 wherein the continuously variable intensity component I*, the relatively constant intensity component I, and the set of discrete available pulse widths are selected to ensure geometric intensity equivalence as the control signal transitions between adjacent pulse widths w of the set of discrete available pulse widths.

4. A method as claimed in claim 1 wherein the set of discrete available pulse widths and the relatively constant intensity component I are derived by referring to a geometric fraction b of an effective pixel width P*.

5. A method as claimed in claim 4 wherein the geometric fraction b is selected to optimize conversion efficiency, taking into account the particular circumstances in which the laser source is employed.

6. A method as claimed in claim 4 wherein the discrete pulse widths w of the set of discrete available pulse widths are established by referring to the following geometric function:

$$w = (b)^n P^*$$

where $$b \leq (1 - w_{min}/P^*)$$

and $w_{min}$ represents a practical minimum pulse width of the laser source, P* is the effective pixel width, b is the geometric fraction of the effective pixel width, and n is a positive integer representing the available pulse widths within the set of discrete available pulse widths.

7. A method as claimed in claim 6 wherein the maximum values for n and the geometric fraction b are selected such that the low-end pulse width w of the set of available pulse widths is greater than the practical minimum pulse width $w_{min}$ of the laser source.

8. A method as claimed in claim 1 wherein:

the relatively constant intensity component I makes a relatively insignificant contribution to pixel intensity at the low-end pulse width w; and the continuously variable intensity component I* and the relatively constant intensity component I occupy different portions of the effective pixel width at the progressively larger pulse widths w.

9. A method as claimed in claim 8 wherein, for the progressively larger pulse widths w, the relatively constant intensity component I occupies at least as much of the effective pixel width as is occupied by the continuously variable intensity component I*.

10. A method as claimed in claim 8 wherein the continuously variable intensity component I*, the relatively constant intensity component I, and the set of discrete available pulse widths are selected to ensure geometric intensity equivalence as the control signal transitions between adjacent pulse widths w of the set of discrete available pulse widths.

11. A method as claimed in claim 8 wherein the relatively constant intensity component I is maximized at the progressively larger pulse widths w.

12. A method as claimed in claim 8 wherein the set of discrete available pulse widths are partitioned uniformly or non-uniformly.

13. A method as claimed in claim 1 wherein:

the set of discrete available pulse widths and the relatively constant intensity component I are derived by referring to a geometric fraction b of an effective pixel width P*; and the low-end pulse width w does not exceed approximately 25% of the effective pixel width P*.

14. A method as claimed in claim 13 wherein the low-end pulse width w is between approximately 2 ns and approximately 10 ns and the effective pixel width P* is between approximately 20 ns and approximately 50 ns.

15. A method as claimed in claim 1 wherein:

the relatively constant intensity component I makes a relatively insignificant contribution to pixel intensity at the low-end pulse width w; and the continuously variable intensity component I* and the relatively constant intensity component I occupy different portions of the effective pixel width at the progressively larger pulse widths w; and the low-end pulse width w does not exceed approximately 25% of an effective pixel width P*.

16. A method of operating a frequency-converted laser source comprising a laser diode optically coupled to a wavelength conversion device for conversion of a pulsed optical signal generated by the laser diode, wherein:

the laser diode is driven in a pulsed mode to define pixel intensity values corresponding to desired gray scale values of image pixels in an image plane of the laser source;

the pixel intensity values are a function of a laser control signal comprising a discontinuous pulse component, a relatively constant intensity component I, and a continuously variable intensity component I*;

the pulse width w of the discontinuous pulse component is selected from a set of discrete available pulse widths according to a desired pixel gray scale value;

a low-end pulse width w of the set of available pulse widths is established for a range of low-end pixel gray scale values;

progressively larger pulse widths w are established for ranges of progressively higher pixel gray scale values;

the relatively constant intensity component I makes a relatively insignificant contribution to pixel intensity at the low-end pulse width w for the range of low-end pixel gray scale values and assumes a non-zero value for enhanced conversion efficiency at the progressively larger pulse widths w established for the higher pixel gray scale values;

the continuously variable intensity component I* and the relatively constant intensity component I occupy a common portion of the effective pixel width at the progressively larger pulse widths w;

the continuously variable intensity component I* varies according to the desired gray scale value of the selected pixel and the contributions of the relatively constant intensity component I and the pulse width w to pixel intensity; and the discrete pulse widths w of the set of discrete available pulse widths are established by referring to the following geometric function:

$$w = (b)^n P^*$$

where $$b \leq (1 - w_{min}/P^*)$$

and $w_{min}$ represents a practical minimum pulse width of the laser source, P* is the effective pixel width, b is the geometric fraction of the effective pixel width, and n is a positive integer representing the available pulse widths within the set of discrete available pulse widths.

* * * * *